United States Patent
Tahon et al.

(10) Patent No.: US 6,309,901 B1
(45) Date of Patent: *Oct. 30, 2001

(54) USE OF GLASS LAMINATE AS A SUBSTRATE IN SEMICONDUCTOR DEVICES

(75) Inventors: Jean-Pierre Tahon, Langdorp; Bartholomeus Verlinden, Tongeren; Rudi Goedeweeck, Rotselaar, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

This patent is subject to a terminal disclaimer.

(21) Appl. No.: 09/529,658
(22) PCT Filed: Oct. 7, 1998
(86) PCT No.: PCT/EP98/06455
  § 371 Date: Apr. 18, 2000
  § 102(e) Date: Apr. 18, 2000
(87) PCT Pub. No.: WO99/21708
  PCT Pub. Date: May 6, 1999

(30) Foreign Application Priority Data

Oct. 24, 1997 (EP) .................................................. 97203312
Sep. 9, 1998 (WO) ................................... PCT/EP98/05748

(51) Int. Cl.$^7$ ........................... H01L 21/00; H01L 21/44; B05D 5/06; B05D 5/12
(52) U.S. Cl. .............................. 438/29; 438/25; 438/584; 427/65; 427/108
(58) Field of Search ................................ 438/584, 22, 25, 438/29; 428/332, 426; 427/108, 65

(56) References Cited

U.S. PATENT DOCUMENTS

| | | | | |
|---|---|---|---|---|
| 5,635,791 | * | 6/1997 | Vickers ................................ | 313/309 |
| 5,686,383 | * | 11/1997 | Long et al. ......................... | 506/227 |
| 6,101,846 | * | 8/2000 | Elledge ................................. | 65/102 |
| 6,120,907 | * | 9/2000 | Tahon et al. ........................ | 428/426 |
| 6,197,418 | * | 3/2001 | Cloots et al. ....................... | 428/332 |

* cited by examiner

Primary Examiner—Richard Elms
Assistant Examiner—Adam J Pyonin
(74) Attorney, Agent, or Firm—Breiner & Breiner, L.L.C.

(57) ABSTRACT

A method for making a semiconductor device is disclosed which comprises the step of applying a functional layer on a substrate, characterized in that said substrate is a laminate which comprises a support and a glass layer, said glass layer having a thickness of less than 700 μm. The support is preferably a plastic foil. The laminate has the combined benefits of low weight and high strength and is therefore a suitable substrate for making flat panel displays such as liquid crystal displays, plasma displays, field emission displays or organic light-emitting polymer displays. Preferred examples of the functional layer are e.g. electroconductive layers, liquid crystal orientation layers, color filters, electroluminescent layers, passivation layers and phosphor layers.

15 Claims, No Drawings

USE OF GLASS LAMINATE AS A SUBSTRATE IN SEMICONDUCTOR DEVICES

This application is a 371 of PCT/EP98/06455, filed Oct. 10, 1998.

FIELD OF THE INVENTION

The present invention is related to the use of a glass-laminate as a substrate for applying functional layers during the manufacturing of semiconductor devices, especially flat panel displays.

BACKGROUND OF THE INVENTION

Liquid crystal displays (LCDs) have been used for several years now as a low-cost information display in e.g. calculators, watches, video games, audio and video equipment, portable computers, car dashboards, etc., i.e. especially in mobile devices wherein low weight is an important feature. Moreover, quality and size have been improved substantially so that LCDs are becoming an interesting alternative for the cathode ray tubes (CRTs) which are being used widely in television sets and desktop computer displays. In the meantime other flat panel display (FPD) types, such as plasma displays (PDs), field emission displays (FEDs) and organic light-emitting polymer displays (OLEDs) are attracting a lot of attention as potential alternatives of LCDs. Being emissive displays, PDs, FEDs or OLEDs may provide a solution for two major problems associated with LCDs, i.e. the low viewing angle and low efficiency (typically, only a few percent of the incident light or backlight passes through an LCD to form a readable image).

In all these FPDs, two glass plates are being used for carrying functional layers, e.g. electroconductive layers for pixel addressing, colour filters, liquid crystal orientation or alignment layers in LCDs or phosphor layers in FEDs and PDs. Between the two glass plates provided with said functional layers, there may be applied a filling, e.g. a liquid crystal compound (LCDs), a light-emmitting polymer (OLEDs) or a plasma-forming gas (PDs). After the assembly of such a sandwich, often called the display cell, one or more foils can be laminated to the outer surface of the glass substrate. In LCDs polariser foils are necessary components which are laminated to the glass substrate. In addition, several other types of foils are widely used to improve the image quality, e.g. retardation film, reflection or anti-reflection foils, foils which improve the viewing angle, light dispersion foils, etc.

Glass plates used in FPDs have a typical thickness in the range from 0.7 to 1.1 mm. Due to the high specific weight of glass, the total weight of a display is mainly determined by the size and thickness of these glass plates. In "Fourth-Generation LCDs—EIAJ Display Forecast", published in "Display Devices", Spring '96, Serial no. 13, p.14–19 (published by Dempa Publications Inc., Tokyo), it is emphasised that weight reduction of FPDs is a major need to be investigated. Weight reduction is important for mobile displays as well as for large stationary displays such as television sets and desktop computer displays. A further reduction of the thickness of the glass plates is however limited due to the high brittleness of such thin glass.

EP-A 759 565 describes a method wherein a functional layer is coated on a flexible, thin glass which is provided with a receiving layer of polycarbonate. Such a substrate is also very brittle since the receiving layer does not improve the probability of breakage.

For some low-cost applications, plastic sheets are being used as a low-weight substrate of an LCD. The high strength and flexibility of plastics even enables the making of a flexible display. However, the liquid crystal composition and other functional layers between said plastic sheets are not well protected from chemicals, oxygen, moisture, mechanical impact and other external influences and, as a result, the lifetime of such plastic displays is limited. In addition, plastics have a very low thermal and dimensional stability compared to glass, which are essential properties required for obtaining high quality displays.

Laminates of glass sheets and plastic foils are known in the art. A well known example is security glass used in car windshields as described in FR 2,138,021 and EP-A 669 205. The latter patent application describes a glass/plastic laminate comprising a glass pane, an intermediate adhesive layer and a plastic pane, wherein the glass has a thickness from 30 to 1000 $\mu$m. The glass is preferably a chemically hardened glass and before lamination, a functional layer can be applied to the glass. After lamination, said functional layer is sandwiched between the glass and the plastic layer and is thereby protected from outside influences. A laminate of a thin chemically hardened glass and a plastic support has also been described in U.S. Pat. No. 3,471,365.

SUMMARY OF THE INVENTION

It is an object of the present invention to provide a method for making a semiconductor device comprising the step of applying a functional layer on a substrate, wherein said substrate is characterised by a low specific weight and low brittleness as well as by a high dimensional and thermal stability, excellent hardness and scratch resistance, good resistance to chemicals such as organic solvents or reactive agents, and low permeability of moisture and gases. This object is realised by the method defined in claim 1. Preferred embodiments of the present invention are defined in the depending claims. Further advantages and embodiments of the present invention will be discussed in the detailed description.

DETAILED DESCRIPTION OF THE INVENTION

The laminate used in the method of the present invention comprises a thin glass layer and a support. The term "laminate" as used herein shall be understood as "a material consisting of a plurality of bonded layers". The glass layer and the support may be bonded to each other by applying an intermediate adhesive layer between them but also vacuum lamination can be used as will be discussed below. The term "support" is used herein in the meaning of a "self-supporting layer", e.g. a plastic sheet, so as to distinguish it from layers which may be coated on a support but which are not self-supporting, e.g. the functional layers discussed in the introduction and further below.

The glass protects the support from scratches, moisture, solvents and gases, and improves the dimensional and thermal stability of the support. The dimensional stability of the laminate depends on the relative thickness of the glass and the support and on the elasticity of both these materials. A laminate consisting of a thin glass substrate and e.g. a plastic support has a dimensional stability which is significantly improved when compared to the plastic support as such. The risk of breakage of the glass is decreased substantially by the presence of the laminated support. Even if the glass would break due to a high local pressure on its surface, the glass fragments remain fixed to the laminated support. Without the lamination, the probability of breakage is very high, especially when thin glass is used as a substrate, and the glass fragments would disturb the manufacturing process significantly. In addition, the specific weight of the laminate as a whole is substantially less than that of glass especially when e.g. plastics are used as support in the laminate.

The glass in the laminate used in the present invention has a thickness of less than 700 μm. For some applications, a thickness lower than 300 μm or even lower than 200 μm may be preferred. For lower brittleness a thickness of not less than 30 μm or even not less than 50 μm may be preferred. Glass according to these specifications is known in the art. EP-A 716 339 describes a thin glass substrate having a thickness lower than 1.2 mm, a failure stress (under tensile stress) equal to or higher than $1 \times 10^7$ Pa and an elasticity modulus (Young's modulus) equal to or lower than $1 \times 10^{11}$ Pa.

The glass may be e.g. sodium float glass, chemically strengthened glass or borosilicate glass. Such glass can be made by squeezing semi-molten glass between metal rollers to produce a thin web. U.S. Pat. No. 4,388,368 describes the following method to produce flexible glass sheets. A soda lime glass ($Na_2O.CaO.SiO_2=15:13:72$ by weight) molten at 1550° C. is drawn and rolled. The glass thus formed is supported by clips at both ends and heated at about 350° C. Thereafter the glass sheet is stretched to from 1.05 to 10 times the area of the original sheet while blowing a hot blast of air at a temperature lower than the aforesaid heating temperature onto the glass sheet, e.g. about 700° C. In this way, the glass sheet is cooled faster at thin portions, and thereby the thickness of the glass sheet thus stretched is maintained uniform. A similar method has been described in JP-A 58,095,622. In another method, described in JP-A 58,145,627, a web of molten glass is pulled upward and immediately drawn horizontally using large rollers onto the surface of a molten metal bath, followed by gradual cooling. The glass thus obtained has improved flatness.

Highly preferred glass for use in the present invention is thin borosilicate glass which is very strong compared to regular sodium float glass. Bororsilicate glass comprises $SiO_2$ and $B_2O_2$. The detailed composition of some borosilicate glass types has been described in e.g. U.S. Pat. Nos. 4,870,034, 4,554,259 and 5,547,904.

Chemically strengthened float glass is also known to have greater strength than regular float glass. Chemically strengthened glass is glass wherein at both surface layers the original alkali ions are at least partially replaced by alkali ions having a larger radius. In chemically hardened sodium lime silica glass, the sodium ions near the surface of the glass are at least partially substituted by potassium and in chemically hardened lithium lime silica glass, the lithium ions near the surface are at least partially substituted by sodium and/or potassium. Known methods for producing chemically strengthened glass are processes wherein glass is exposed to ion exchange conditions as described in e.g. JP-A 56,041,859, GB 1,208,153 and U.S. Pat. No. 3,639,198. More details about chemical strengthening of glass are given in e.g. "Glass Technology", Vol. 6, No. 3, page 90–97, Jun. 1965.

Thin glass is commercially available, e.g. from Pilkington and Corning. Preferred thin borosilicate glass for use in the method of the present invention is commercially available from e.g. Deutsche Spezialglass AG (Desag, Germany), a Schott Group company, as types AF45 and D263 with a thickness as low as 30 μm. According to the technical brochure "Alkali Free and Low Alkali Thin Glasses", subtitle "AF45 and D263: Thin Glasses for Electronic Applications", published by Desag in 1995, thin borosilicate glass is available in a thickness of 30 μm, 50 μm, 70 μm, 100 μm, 145 μm, 175 μm, 210 μm, 300 μm, 400 μm, 550 μm and 700 μm.

The support, which according to the present invention is laminated to the glass, can be paper or metal and more preferably a plastic foil such as cellulose acetate, poly(vinyl acetal), polystyrene, polycarbonate (PC), poly(ethylene terephtalate) (PET), polyethylene, polypropylene, polyethersulphone (PES). Also copolymers can be used, e.g. a copolymer of acrylonitrile, styrene and butadiene or cyclo-olephine copolymers (COCs) such as copolymers comprising (poly)dicyclopentadiene (PDCP). PET, PC, PES and PDCP are highly preferred.

The support has preferably a thickness of less than 500 μm and even more preferably less than 250 μm. When the laminate is used in high-temperature processes, it may be beneficial to use a very thin support, e.g. having a thickness ranging from 10 to 50 μm, so as to avoid extensive curl of the material due to different thermal shrinkage or expansion of the glass and the support. When used in image recording materials or flat panel displays, the support is preferably a transparent support. In a preferred embodiment the support as well as the adhesive layer are characterised by substantially the same refractive index as the glass.

Methods for laminating the glass to the support are well known. Both layers may be laminated without the use of an adhesive layer by so-called vacuum lamination. In order to obtain an effective bond between the glass and the support by vacuum lamination, both these materials are preferably characterised by a low surface roughness, e.g. the support preferably does not contain a so-called spacing agent, which is often introduced in plastic foils or in coatings on foils to prevent sticking. In addition to vacuum lamination, the use of double-sided adhesive tape or an adhesive layer, obtained by applying e.g. a hotmelt or a latex followed by the application of heat or pressure, is highly preferred. Said latex is e.g. polyurethane, polyethylene, poly(methyl acrylate) or ethylene-vinyl acetate. Alternatively a slightly moistened gelatine layer can also be used as an adhesive layer.

The adhesive layer may be applied either to the glass, to the support, or to both and may be protected by a stripping layer, which can be removed just before lamination. After lamination, the bond between the glass and the support may be permanent or reversible. In the latter case, the glass and the support can again be delaminated from each other.

Lamination of the glass and the support can be effected manually but preferably is effected in a laminating means called a laminator. A typical laminator comprises a pair of heatable rollers, having an adjustable pressure and moving at a fixed or an adjustable speed. The lamination with a laminator is effected by bringing the glass and the support in close contact to each other and optionally applying an adhesive between both materials, which are then put through between the rollers of the laminator.

The adhesive layer may be a temperature-sensitive adhesive (TSA) layer, a pressure-sensitive adhesive (PSA) layer or an adhesive that is curable by ultraviolet radiation (UVA), by exposure to an electron beam or which is thermally curable. Polymers in typical water-coatable TSA's are latices having a glass transition temperature (tg) below 80° C. When the laminate of the present invention is to be used in a process requiring high temperatures, such as during the manufacturing of a flat panel display, suitable TSA's preferably contain polymers having a Tg that is at least 10° C. higher than the highest temperature of process. For similar reasons, a PSA or a curable adhesive is preferred which is thermally stable up to a temperature of 150° C. or even 200° C.

Preferred PSA layers for use in the present invention comprise one or more tacky elastomers, e.g. block copolymers of styrene/isoprene, styrene/butadiene rubbers, butyl rubbers, polymers of isobutylene and silicones. Particularly preferred are natural rubbers and acrylate copolymers as disclosed in U.S. Pat. No. 3,857,731. Said acrylate polymers preferably consist of 90 to 99.5% by weight of at least one alkyl acrylate ester and 10 to 0.5% by weight of a monomer selected from the group consisting of substantially oil-insoluble, water-soluble, ionic monomers and maleic anhydride. The acrylate ester portion preferably consists of those monomers that are hydrophobic, water emulsifiable, substantially water insoluble and which as homopolymers generally have a glass transition temperature of 20° C. or less. Examples of such monomers are iso-octyl acrylate, 4-methyl-2-pentyl acrylate, 2-methylbutyl acrylate and sec-butyl acrylate. Other examples of suitable monomers are e.g. trimethylamine methacrylamide, trimethylamine p-vinylbenzimide, ammonium acrylate, sodium acrylate, N,N-dimethyl-N-1-(2-hydroxypropyl) amine methacrylamide and maleic anhydride. The PSA preferably has a continuous-coat (100% coverage) peel adhesion value, when applied to untreated paper, between 0.1 and 10 N/cm width.

The PSA may further contain a binder. Suitable binders are inert towards the pressure-sensitive adhesives, i.e. they do not chemically attack the pressure-sensitive adhesives. Example of such binders are nitrocellulose, urethanes, gelatine, polyvinyl alcohol, etc. The amount of binder should be chosen such that the pressure-sensitive adhesives laminate effectively. Preferably the amount of binder is lower than 2.5 parts by weight with respect to the pressure-sensitive adhesives and more preferably lower than 0.6 parts by weight UVA's can be broadly classified into two categories: free radical polymerised and catioinic polymerised. Polymers formed by free radical polymerisation are generally based upon acrylic monomers or oligomers which are converted to high molecular weight polymers by crosslinking upon exposure to ultraviolet radiation. The UVA preferably contains a photo-initiator such as a benzophenone-amine, alpha-substituted acetophenone or amino-acetophenone. The addition of isopropyl thioxanthone is known to have a sensitising effect on the photo-initiator and to shift the useful exposure to near visible light, which is important for user safety. Other ingredients typically used in UVA's are flexibilisers such as thermoplastics solvated or dispersed in the acrylic material, adhesion promoters such as polyethylene or polypropylene, and fillers. Additional information on UVA's can be found in RadCureLetter No. 5 (1996) and Tappi Journal, Jan. 1992, p. 121–125. Electron beam curable adhesives work in principle according to the same mechanism as UV-curable adhesive, however without requiring a photo-initiator.

Examples of suitable adhesives for use in the present invention are Solucryl (trade name by UCB, Belgium), preferably Solucryl types 355 HP, 380 and 825D; Rhodotak (trade name by Rhone-Poulenc); Acronal (trade name by BASF); Duro-Tak 380-2954 (trade name by National Starch & Chemical B.V.); PERMAprint type PP2011 and PERMAgard type PG7036 (trade names by Varitape N.V., Belgium).

In the method of the present invention, a functional layer can be applied to the support but preferably is provided on the glass side of the laminate. Before applying said functionally layer, the surface of the glass can be pre-treated, e.g. can be etched or pre-coated with a subbing layer for a good adherence to the functional layer. Particularly suitable subbing layers for said purpose are on the basis of silicon containing compounds, e.g. those described in U.S. Pat. No. 3,661,584 and GB 1,286,467. Said silicon containing compound is preferably an epoxysilane and may also be added to the coating composition of the functional layer. The glass can also be coated with a silicone sol/gel coat having preferably a thickness of at least 1 $\mu$m, and more preferably a thickness of at least 10 $\mu$m. Such a silicate sol/gel passivation layer is typically applied on sodium glass used in a flat panel display to prevent diffusion of sodium ions to the electroconductive layer applied on the glass. When alkaline-free borosilicate glass is used in the laminate of the present invention, such a silicate sol/gel coat is not necessary.

The functional layer can be applied on the laminate by sputtering, by physical vapour deposition, by chemical vapour deposition, as well as by coating from a liquid coating solution such as spin coating, dip coating, rod coating, blade coating, air knife coating, gravure coating, reverse roll coating, extrusion coating, slide coating and curtain coating. An overview of these coating techniques can be found in "Modern Coating and Drying Technology", Edward Cohen and Edgar B. Gutoff Editors, VCH publishers, Inc, New York, NY, 1992. A plurality of layers may be coated simultaneously, e.g. by coating techniques such as slide coating or curtain coating.

According to the present invention, the advantageous properties of the laminate used in the present invention, such as low weight and high strength, make it an excellent substrate for manufacturing semiconductor devices such as solar cells, cameras, projection displays, and especially FPDs. The laminate may be used as a sheet or as a web. The latter is especially preferred for roll-to-roll manufacturing of flat panel displays as will be discussed below.

A highly preferred FPD is an LCD. A typical LCD cell comprises two parallel glass plates which each carry on their inner surface an electroconductive layer and a liquid crystal orientation layer, also called alignment layer. In colour LCDs, one of the glass plates is also provided with a colour filter. When provided on a glass-laminate as defined hereinbefore, these electroconductive layers, alignment layers and colour filters shall be regarded as being applied according to the method of the present invention.

A liquid crystal orientation layer typically consists of a polyimide film which is mechanically rubbed so that the director of the liquid crystal molecules aligns itself with the rubbing direction. More information can be found in e.g. "Surface alignment of liquid crystals by rubbed polymer layers", by A. Mosley and B. M. Nicholas, published in Displays, pp. 17–21, Jan. 1987.

Coatings consisting of tin oxide, indium oxide or tin-doped indium oxide (ITO) are widely used as electroconductive layers in flat panel displays because these materials posses high transparency in the visible spectrum combined with a fairly low electrical resistively. ITO can be coated by e.g. RF-sputtering from and ITO target, described by J. L. Vossen in Physics of thin films, pp 1–71, Academic Press, N.Y. (Plenum Press, 1977) or reactive DC magnetron sputtering from an indium-tin target, described in Thin Solid Films, Vol. 83, pp. 259–260 (1981) and Vol. 72, pp. 469–474 (1980), followed by thermal treatment.

According to the present invention, the laminate of the present invention may also be provided with non-continuous functional layers, e.g. electroconductive patterns defining electronic components such as the rows and columns used for multiplex-addressing in passive-matrix LCDs or the thin-film-transistors (TFTs) and pixel electrodes used in active-matrix LCDs. For the application of such patterns, photolithographic as well as printing techniques can be used. The non-continuous layer can also be formed on the laminate by other techniques, e.g. lamination followed by delamination, ink jet, toner jet, electrophotography, or thermosublimation.

The colour filters, which similarly to the above electroconductive patters and layers are not only used in LCDs but also in other FPD types, are another example of a non-continuous layer that may be applied by the method of the present invention. The colour filter can be a gelatine-based filter, a vacuum deposited filter, a printed filter, an interference filter, an electrolytically deposited filter, etc. Some suitable examples can be found in e.g. "High quality organic pigment colour filter for colour LCD" by T. Ueno, T. Motomura, S. Naemura, K. Noguchi and C. Tani in Japan Display, 1986, pp. 320–322; "An active matrix colour LCD with high transmittance using an optical interference filter" by T. Unate, T. Nakagawa, Y. Matsushita, Y. Ugai and S. Acki in SIE Int. Display Conf., pp. 434–437, 1989; "New process for preparing multi-colour filters for LCDs" by A. Matsumura, M. Ohata and K. Ishikawa in SID Int. Display Conf., pp. 240–2443, 1990; Eurodisplay '87 proceedings, pp. 379–382 and 395–396; EP-B 396 824 and EP-A 615 161.

After applying these functional layers onto the glass-laminate defined hereinbefore, two such laminates can be combined in an assembly step to obtain a so-called LCD cell, wherein the space between the glass plates is filled with a liquid crystal composition and spacers. The support may be removed from the glass before or after said assembly step or can also remain fixed to the glass. After the assembly step, polarisers and other foils can be laminated to the LCD cell, e.g. foils which improve the image quality such as retardation film reflection or anti-reflection foil, foils which improve the viewing angle, light dispersion foils, etc. These foils shall not be regarded as functional layers which can be applied according to the present invention, because these foils are self-supporting layers, and thus do not comply with the definition of 'functional layer' given above.

The method described above can be used during the manufacturing of passive-matrix LCDs as well as active-matrix LCDs such as thin-film-transistor (TFT) displays. Particular examples are twisted nematic (TN), supertwisted nematic (STN), double supertwisted nematic (DSTN), retardation film supertwisted nematic (RFSTN), ferroelectric (FLC), guest-host (GH), polymer-dispersed (PF), polymer network (PN) liquid crystal displays, and so on.

Emissive FPD types which may benefit from the present invention are e.g. plasma displays (PDs), field emission displays (FEDs) and so-called organic light-emitting polymer displays (OLEDs). In such electroluminescent displays, the electroconducting layers or patterns on at least one of the glass plates may be replaced by a non-transparent material, e.g. silver or nickel.

PDs comprise two glass plates enclosing a gas-filled volume, the gas being typically one of the noble gases or a mixture thereof. By charging the electrodes present in the gas-filled cavity with a high voltage, typically about 100 V, a plasma discharge is generated which emits UV light. In many designs, the discharges are confined to separate cells (pixels) formed by walls of insulating material between the glass plates. The UV light may excite phosphors which are present on the cell walls so as to obtain colour images. To eliminate the orange light which may also be emitted by the plasma, colour filters are also used in FEDs. The electroconductive layers or patterns may be shielded from the plasma by applying a dielectric protecting layer, which comprises e.g. lead oxide or magnesium oxide. Also said insulating walls, phosphors, colour filters and dielectric protecting layers shall be regarded as a (non-continuous) functional layer which may be applied according to the method of the present invention.

FEDs also comprise two glass plates which are provided with functional layers. In addition to the electroconductive layers and patterns known from LCDs and PDs, one of the glass plates of a FED is provided with a large number of microtips, consisting of e.g. molybdenum, which each act as a microscopic electron gun. When charged up to a high voltage from 200 to 800 V, these microtips emit an electron beam towards a phosphor layer on the opposite glass plate which typically carries an ITO layer as a counter electrode. The electroconductive layers and patterns, microtips and phosphor layers in FEDs shall also be regarded as functional layers which may be applied according to the method of the present invention.

OLEDs contain an electroluminescent polymer as light-emitting compound, e.g. p-phenylenevinylene, flourene derivatives and distyrylbenzene compounds. Some particular examples have been disclosed in e.g. U.S. Pat. Nos. 5,247,190 and 5,401,827. An extensive survey has been published in "Organic electroluminescent materials and devices", edited by S. Miyata and H. S. Nalwa, Gordon and Breach Publishers (1997). A typical OLED consists of a reflecting anode, an electron transport layer, a light-emitting layer, a hole transport layer and a transparent anode, all these layers being sandwiched between two glass plates or plastic sheets. Colour OLEDs can be made by stacking three such basic cells on top of each other, each emitting one of the primary colours. When applied on the glass laminate defined herein, these functional layers known from OLEDs shall also be regarded as being made according to the method of the present invention.

The laminate used in the present invention can also be a flexible material. The feature "flexible" as used herein means that the material is capable of being wound around a core. A preferred flexible laminate is capable of being wound around a cylindrical core having a radius of 1.5 m without breaking. The lower the thickness of the glass, the higher is its flexibility and thus the lower the minimum radius of the core around which the material can be wound without breaking. However, the brittleness of the glass is inversely proportional to the thickness of the glass and the best compromise between flexibility and brittleness depends on the application. A flexible laminate as used in the present invention can thus be provided with functional layers using a continuous web coating apparatus, thereby enabling industrial roll-to-roll manufacturing of flat panel displays which may significantly reduce the cost of the process compared to the batch methods that are being used at present.

Another example of a FPD which may benefit from the present invention is a so-called electronic book, such as the devices described in WO 97/04398.

EXAMPLE

A flexible borosilicate glass sheet of type AF45, defined above and having a thickness of 100 µm, was laminated to a PET foil having a thickness of 170 µm by using Solucryl (trade name by UCB, Belgium), type 355 HP as an adhesive layer between the glass and the PET foil. This laminate was used as a substrate to coat on the glass side thereof an anti-halation layer, a blue sensitive emulsion layer, a first intermediate layer, a green sensitive emulsion layer, a second intermediate layer and a red sensitive emulsion layer. These layers were coated with a standard coating apparatus used in silver halide photographic film making. The colour negative material thus obtained can be used to make colour filter as described below. The composition of said layers has been disclosed in EP-A 802 453, and will be reproduced hereinafter.

Anti-halation layer

A non-diffusing yellow dye of formula YD, was dispersed in gelatine. To this dispersion epoxysilane E acting as an adhesion promotor was added. The coverage of yellow dye YD, gelatine and epoxysilane E was 0.5, 1.5 and 0.1 g/m² respectively.

Blue sensitive layer

A 100% silver chloride emulsion with an average grain size of 0.4 µm was sensitised to blue light with a spectral sensitising agent of formula SB. A yellow dye forming coupler of formula Y1 was added to this emulsion. The amounts of silver halide, gelating and colour couplier Y1 were 0.57, 3.30 and 1.0 g/m² respectively.

First intermediate layer

A substance of formula SD1, capable of scavenging oxidised colour developing agent was dispersed in gelatine and coated at a coverage of 0.08 g/m² of SD1 and of 0.77 g/m² of gelatine.

Green sensitive layer

A silver chloride-bromide (90/10 molar ratio) emulsion with an average grain size of 0.12 µm was sensitised to green light with a spectral sensitising agent of formula SG. A magenta dye forming coupler of formula M1 was added to this emulsion. The amounts of silver halide, gelatine and colour coupler M1 were 0.71, 2.8 and 0.53 g/m² respectively.

Second intermediate layer

This layer had the same composition as the first intermediate layer.

Red sensitive layer

A silver chloride-bromide (90/10 molar ratio) emulsion with an average grain size of 0.12 µm was sensitised to red light with a spectral sensitising agent of formula SR. A cyan dye forming coupler of formula C1 was added to this emulsion. The amounts of silver halide, gelatine and colour coupler C1 were 0.49, 6 and 0.95 g/m² respectively.

Yellow, magenta and cyan water-soluble dyes, acting as accutance dyes were present at an appropriate coverage in the blue, green en red sensitive layer respectively and hydroxy-trichloro-triazine acting as hardening agent was present in the red sensitive layer at a coverage of 0.035 g/m².

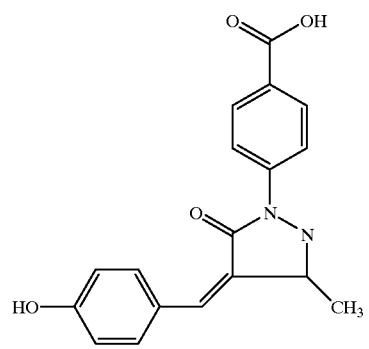

(YD)

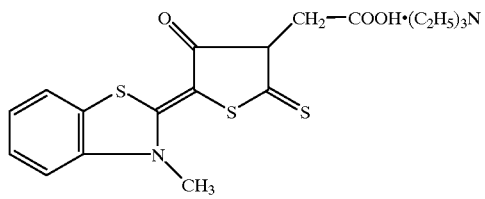

(SB)

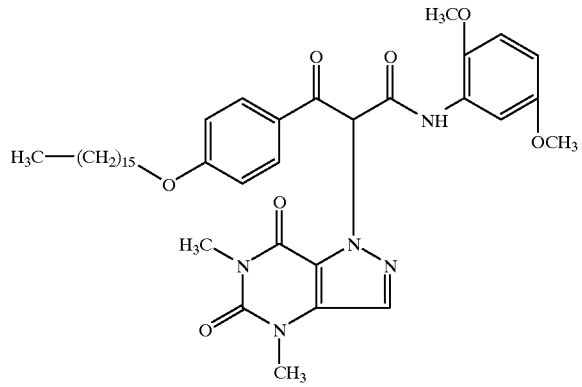

(Y1)

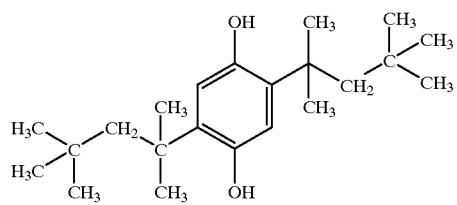

(SD1)

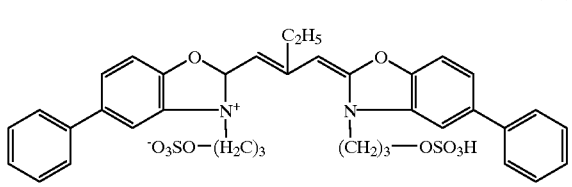

(SG)

-continued

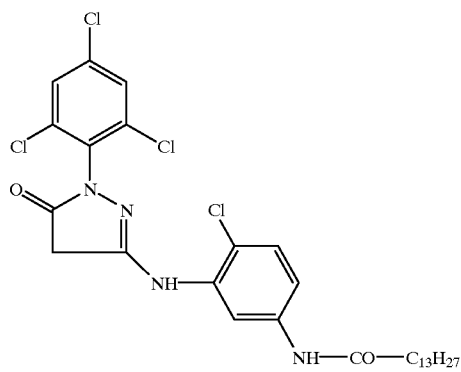
(M1)

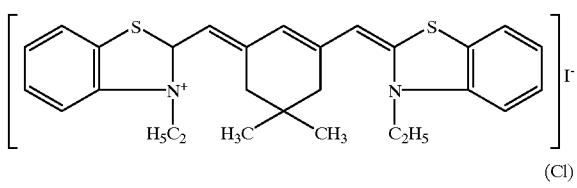
(SR)

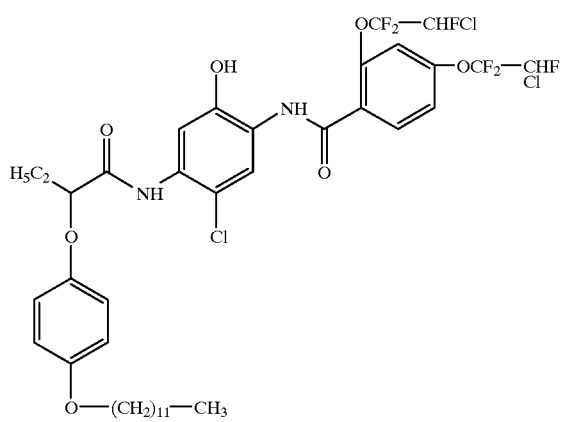
(Cl)

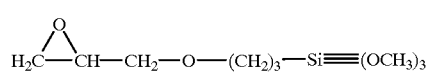
(E)

This material was then exposed using a single-step pixel-wise exposure through a multi-colour master and processed according to the following procedure:

| Developer | |
|---|---|
| Sodium sulphite (anhydrous) | 4 g |
| 4-amino-3-methyl-N,N-diethylaniline hydrochloride | 3 g |
| sodium carbonate (anhydrous) | 17 g |
| sodium bromide | 1.7 g |
| sulphuric acid 7 N | 0.62 ml |
| water up to | 1000 ml |

After development the material was treated in an acid stop bath prepared by adding water up to 1 l to 50 ml of sulphuric acid 7 N.

The treatment with stop bath was followed by 2 minutes rinsing in plain water followed by a 2 minutes fixing in an aqueous solution having the following composition:

| | |
|---|---|
| 58% aqueous solution of $(NH_4)_2S_2O_3$ | 100 ml |
| sodium sulphite (anhydrous) | 2.5 g |
| sodium hydrogen sulphite (anhydrous) | 10.3 g |
| water up to | 1000 ml |

The treatment with fixing liquid was followed by a 2 minutes rinsing in plain water followed by a 3 minutes bleaching in an aqueous solution having the following composition:

| | |
|---|---|
| potassium hexacyanoferrate (III) (anhydrous) | 30 g |
| sodium bromide (anhydrous) | 17 g |
| water up to | 1000 ml |

Then the material was treated with the fixing liquid again and rinsed for 3 minutes with plain water.

Finally the material was treated with an aqueous solution having a pH of 9 and containing per liter 20 ml of a 40% aqueous solution of formaldehyde serving as hardening agent.

After the above processing, a multi-colour filter suitable for FPDs was obtained, said filter consisting of a yellow image, a magenta image and a cyan image each at maximum density. Compared to the prior art, as described in e.g. EP-A 802 453 wherein the same composition is coated on a glass plate having a thickness of 1.5 mm, the multi-colour filter of the present example is characterised by a much lower weight. In addition, the thermal and dimensional stability of the laminate is significantly better compared to a plastic substrate such as the PET foil used in the example.

What is claimed is:

1. Method for making a semiconductor device comprising the step of applying a functional layer on a substrate, optionally provided with an intermediate layer, wherein said substrate is a laminate which comprises a support and a glass layer, said glass layer having a thickness of less than 700 µm.

2. Method according to claim 1 wherein the functional layer is an electroconductive layer.

3. Method according to claim 1 wherein the functional layer is a colour filter.

4. Method according to claim 1 wherein the functional layer is a liquid crystal orientation layer.

5. Method according to claim 1 wherein the functional layer is a passivation layer.

6. Method according to claim 1 wherein the functional layer is a phosphor layer.

7. Method according to claim 1 wherein the functional layer is a dielectric protecting layer.

8. Method according to claim 1 wherein the functional layer is an electroluminescent layer.

9. Method according to claim 1 wherein the semiconductor device is a flat panel display.

10. Method according to claim 1 wherein the glass layer has a thickness of less than 500 µm.

11. Method according to claim 1 wherein the glass layer has a thickness of less than 300 µm.

12. Method according to claim 1 wherein the support consists essentially of poly(ethylene tereph-thalate), polycarbonate, polyethersulfone or cyclo-olefin copolymers.

13. Method according to claim 1 wherein the functional layer is applied on the glass side of the laminate.

14. Method according to claim 1 wherein the glass is borosilicate.

15. Method according to claim 1 wherein the functional layer is applied on the substrate by means of a web coating apparatus.

* * * * *